United States Patent
Schoenborn et al.

(10) Patent No.: US 8,750,138 B2
(45) Date of Patent: *Jun. 10, 2014

(54) PHYSICAL LAYER LOOPBACK

(71) Applicant: Intel Corporation, Santa Clara, CA (US)

(72) Inventors: Theodore Zale Schoenborn, Portland, OR (US); Andrew Martwick, Folsom, CA (US); David Dunning, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/722,942

(22) Filed: Dec. 20, 2012

(65) Prior Publication Data

US 2013/0114420 A1    May 9, 2013

Related U.S. Application Data

(63) Continuation of application No. 13/073,254, filed on Mar. 28, 2011, and a continuation of application No. 11/842,280, filed on Aug. 21, 2007, now Pat. No. 7,936,684, which is a continuation of application No. 10/394,363, filed on Mar. 21, 2003, now Pat. No. 7,324,458.

(51) Int. Cl.
*G06F 11/27* (2006.01)
*G01R 31/317* (2006.01)

(52) U.S. Cl.
CPC .......... *G01R 31/31716* (2013.01); *G06F 11/27* (2013.01)
USPC ........................................................ 370/249

(58) Field of Classification Search
CPC ........................... G01R 31/3176; G06F 11/27
See application file for complete search history.

(56) References Cited

U.S. PATENT DOCUMENTS

| | | |
|---|---|---|
| 3,937,882 A | 2/1976 | Bingham |
| 4,170,722 A | 10/1979 | Blackburn |
| 4,685,102 A | 8/1987 | Lewis |
| 4,761,646 A | 8/1988 | Choquet et al. |
| 5,477,531 A | 12/1995 | McKee et al. |
| 5,553,059 A | 9/1996 | Emerson et al. |
| 5,566,161 A | 10/1996 | Hartmann et al. |
| 5,574,849 A | 11/1996 | Sonnier et al. |
| 5,648,972 A | 7/1997 | Gharakhanian |
| 5,666,302 A | 9/1997 | Tanaka et al. |
| 6,512,740 B1 | 1/2003 | Baniewicz et al. |
| 6,546,343 B1 | 4/2003 | Batra et al. |
| 6,617,943 B1 | 9/2003 | Fazelpour |
| 6,816,987 B1 | 11/2004 | Olson et al. |

(Continued)

OTHER PUBLICATIONS

"PCI Express Base Specificaiton Revision 1.0", Apr. 29, 2002, PCI-SIG, entire document.*

(Continued)

*Primary Examiner* — Joseph Bednash
(74) *Attorney, Agent, or Firm* — Blakely, Sokoloff, Taylor & Zafman LLP (57) ABSTRACT

In some embodiments, a chip comprises control circuitry to provide inband signals, inband output ports, and transmitters to transmit the inband signals to the inband output ports. The control circuitry selectively includes loopback initiating commands in the inband signals. Other embodiments are described and claimed.

34 Claims, 7 Drawing Sheets

(56) References Cited

U.S. PATENT DOCUMENTS

| | | |
|---|---|---|
| 6,912,209 B1 | 6/2005 | Thi et al. |
| 7,319,705 B1 | 1/2008 | Wu et al. |
| 2003/0018788 A1 | 1/2003 | Zsohar |
| 2003/0133417 A1 | 7/2003 | Badt, Jr. |
| 2004/0078483 A1 | 4/2004 | Simila et al. |
| 2004/0186688 A1 | 9/2004 | Nejedlo |

OTHER PUBLICATIONS

PCI Express Base Specification Revision 1.0, Jul. 22, 2002, cover page, p. 4 and pp. 155-220.

Serial ATA: High Speed Serialized AT Attachment, Revision 1.0, Aug. 29, 2001, cover page and pp. 1-7, 97-116, 143-145, and 190-192.

Infiniband TM Architecture Specification vol. 1, Release 1.0, Oct. 24, 2004, Final, cover page and pp. 2-25 and 790-812.

Final Office Action issued for U.S. Appl. No. 13/073,254, mailed May 6, 2013, 33 pages.

Non-Final Office Action issued for U.S. Appl. No. 13/073,254, mailed Dec. 27, 2013, 46 pages.

\* cited by examiner

PHYSICAL LAYER LOOPBACK

CROSS-REFERENCE TO RELATED APPLICATION

This application is a Continuation of U.S. patent application Ser. No. 13/073,254, filed on Mar. 28, 2011, and entitled "PHYSICAL LAYER LOOPBACK", which is a continuation of U.S. patent application Ser. No. 11/842,280, filed on Aug. 21, 2007, now granted as U.S. Pat. No. 7,936,684 and entitled "PHYSICAL LAYER LOOPBACK", which is a Continuation of U.S. patent application Ser. No. 10/394,363 filed on Mar. 21, 2003, now granted as U.S. Pat. No. 7,324,458 on Jan. 29, 2008 and entitled "PHYSICAL LAYER LOOPBACK". These applications are incorporated herein by reference in their entirety.

BACKGROUND

1. Technical Field

The present inventions relate to loopback of signals from a first chip to a second chip and back to the first chip.

2. Background Art

Loopback refers to a process wherein a first chip transmits signals to a second chip and the second chip sends the signals back to the first chip. Loopback is used in analog and digital validation, test, and debug. "Inband" interconnects (conductors) carry inband signals that include data. "Side band" interconnects (also called "out of band" interconnects carry commands, but not the data. The inband signals on the inband interconnects may be packetized to include traditional data with other information such as commands, address (destination), and headers. The signals to be looped back are typically sent from the first chip to the second chip on inband interconnects. When the second chip is in a loop back mode, it transmits all or almost all of the signals back through inband interconnects to the first chip. The inband interconnects carrying the signals back to the first chip may be the same as or different than the inband interconnects that carrying the signals to the second chip.

In prior art techniques, the loopback mode is initiated through loopback initiating signals provided to the second chip through sideband interconnects. Further, the loopback initiating signals are provided to the second chip in response to software, such as an operating system, rather than in response to physical circuitry. Using an operating system to initiate loopback may mask a failure because of error correction. Product validation can be significantly impaired because of a lack of ability to isolate exact failing conditions.

Various techniques have been developed for chips to communicate with each other. The techniques include those that have been standardized and those that have not been standardized. An example of standardized techniques include versions of the Peripheral Chip Interconnect (PCI) Local Bus Specification, such as a PCI Local Bus Specification rev. 2.2, dated Dec. 18, 1998, by the PCI Special Interest Group (SIG). A PCI Express specification, formerly known as 3GIO ($3^{rd}$ generation input output), is in the process of being defined by the PCI SIG. A PCI Express Base Specification Revision 1.0, Jul. 22, 2002, has been released and is available with the payment of a fee.

Signals are often applied differentially on two interconnects. The term "common mode" refers to the average voltage on the interconnects. Systems have used capacitors in series with interconnects to pass the difference between signals on the two interconnects, but not the common mode under ordinary operation. The 8b/10b code is a commonly used code in serial links.

BRIEF DESCRIPTION OF THE DRAWINGS

The inventions will be understood more fully from the detailed description given below and from the accompanying drawings of embodiments of the inventions which, however, should not be taken to limit the inventions to the specific embodiments described, but are for explanation and understanding only.

DETAILED DESCRIPTION

1. Overview of Examplary Systems

Figure 1:
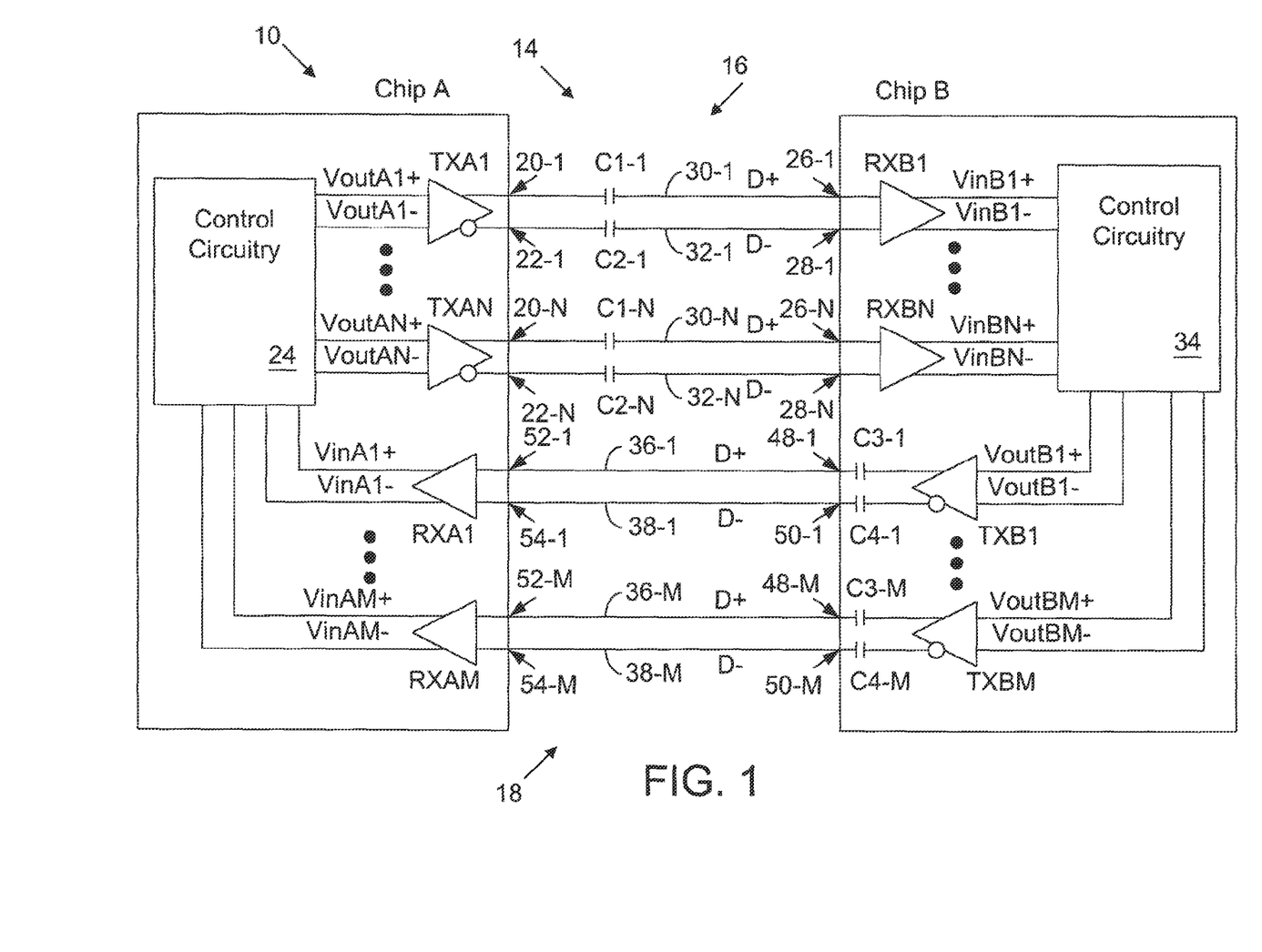
FIG. 1 is a schematic block diagram representation of a system according to some embodiments of the inventions.

FIG. 1 illustrates a system 10 having a first chip (chip A) and a second chip (chip B) coupled through a link 14. In the example of FIG. 1, chips A and B are sometimes in ordinary operating modes in which chip A sends inband signals to chip B over inband interconnects 16 without the expectation that the signals be looped back by chip B and, in fact, chip B does not loopback the signals. However, when chip A is in a loopback initiating mode, it provides a loopback initiating command to chip B on at least one of inband interconnects 16 (which include inband interconnects 30-1, 32-1 . . . 30-N, 32-N). As an example, the loopback initiating command may be bit 2=1 (assert) in a PCI Express training sequence, but that is not required.

In response to receiving the loopback initiating command, control circuitry 34 of chip B goes into a loopback mode and loops back some or all of the inband signals it receives through inband interconnects 18 (which include inband interconnects 36-1, 38-1 . . . 36-M, 38-M, where M may or may not equal N). The loopback mode of chip B continues until chip B detects an end of loopback indication, discussed below. In the case of differential signaling as in FIG. 1, the signals are returned from chip B on at least two of the inband interconnects 18. In the case of single ended (non-differential) signaling, discussed below, the signals are return on at least one of the inband interconnects back to chip A.

When it is said that a signal is looped back, it is understood that voltage and timing characteristics of a signal from chip A that is being looped back may be to some extent modified by circuitry in chip B (e.g., by one or more of transmitters TXB1 . . . TXBM and perhaps other circuitry). Accordingly, the voltage and timing of the signals returning from chip B are not necessarily identical to the signals from chip A to chip B. Chip B may try to maintain the voltage and timing of the signals being loopback back, or it may try to "correct" the voltage and timing.

Although FIG. 1 is described in terms of chip B being in loopback mode in response to a loopback initiating command from chip A, in some embodiments chip B could send a loopback initiating command to chip A so that chip A is in loopback mode and loops back signals to chip B.

In operation, control circuitry 24 provides signals VoutA1+, VoutA1− . . . VoutAN+, VoutAN− to transmitters TXA1 . . . TXAN which transmit these as differential inband signals D+ and D− on inband interconnects 30-1, 32-1 . . . 30-N, 32-N. Receivers RXB1 . . . RXBN provide the received signals to control circuitry 34. As shown in FIG. 1, receives RXB1 . . . RXBN provide the received signals as differential signals VinB1+, VinB1− . . . VinBN+, VinBN− to control circuitry 34, although receivers RXB1 . . . RXBN could convert them to signal ended signals. Likewise, control circuitry 34 provides differential signals VoutB1+, VoutB1− . . . VoutBM+, VoutBM− to transmitters TXB1 . . . TXBM which transmit these as differential inband signals D+ and D− on interconnects 36-1, 38-1 . . . 36-M, 38-M. Receivers RXA1 . . . RXAM provide the received signals (or inverses of them) to control circuitry as differential signals VinA1+, VinA1− . . . VinAM+, VinAM− for control circuitry 34 or could convert them to signal ended signals. In some embodiments, the transmitters and receivers do not invert the signals they receive, but in other embodiments, they could invert them.

Chip A include ports 20-1, 22-1 . . . 20-N, 22-N. Examples of ports include die pads. Likewise, chip A includes ports 52-1, 54-1 . . . 52-M, 54-M and chip B includes ports 26-1, 28-1 . . . 26-N, 28-N and ports 48-1, 50-1 . . . 48-M, 50-M. These ports are referred to as inband ports because they are ports to interconnects that carry inband signals. In the example of FIG. 1, ports 20-1, 22-1 . . . 20-N, 22-N and 48-1, 50-1 . . . 48-M, 50-M are inband output ports and ports 26-1, 28-1 . . . 26-N, 28-N and ports 52-1, 54-1 . . . 52-M, 54-M are inband input ports, but ports could be bi-directional. Chips A and B may be chips on a card(s), motherboard(s), or other substrate(s). The interconnects illustrated represent one or more of the following: slots, fingers, traces, and other conductive materials that may be present between the chips. There may be more than one chip on a card, motherboard, or other substrate. Multiple chips may be coupled to one or more than one chip.

Figure 2:
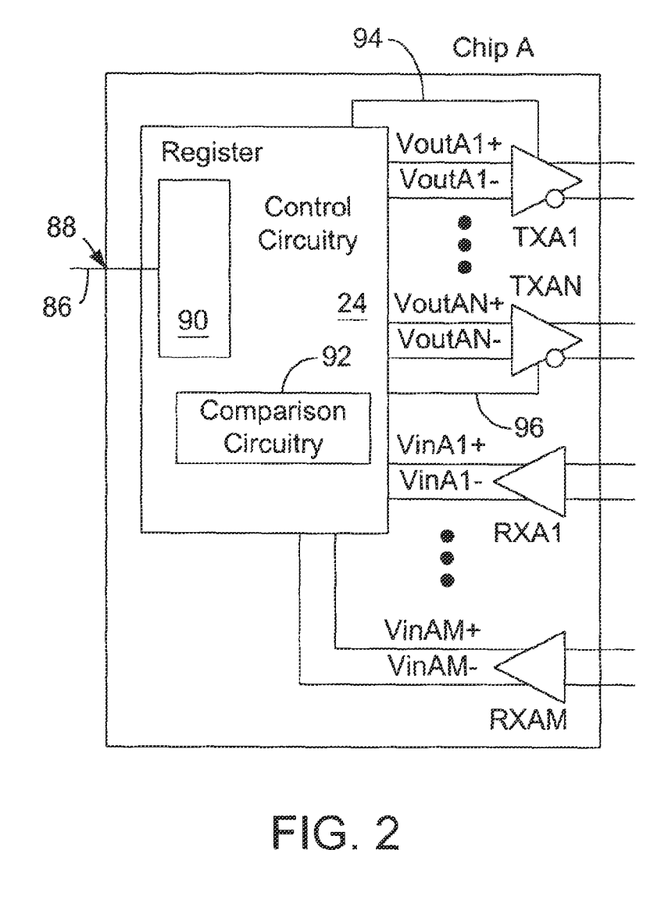
FIG. 2 is a schematic block diagram representation of some details of chip A of FIG. 1 according to some embodiments of the inventions.
Figure 3:
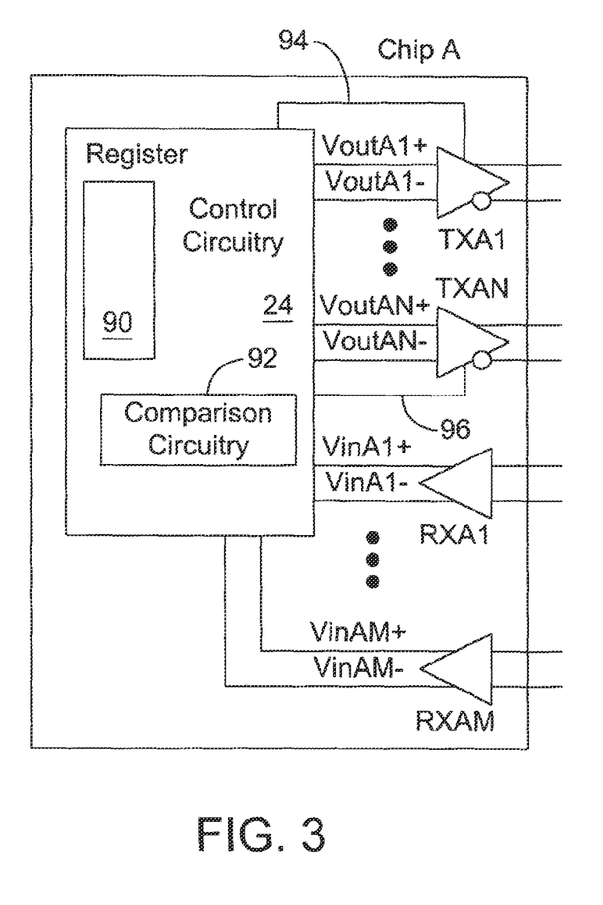
FIG. 3 is a schematic block diagram representation of some details of chip A of FIG. 1 according to some embodiments of the inventions.

FIGS. 2 and 3 illustrate details of some embodiments of chip A of FIG. 1, but other details may be used. The details of FIG. 2 or 3 may be used in chip B of FIG. 1 and chips in FIGS. 4-11, but they are not required. Control circuitry 24 includes a mode controlling register 90 that controls the modes of control circuitry 24. In FIG. 2, at least part of the contents of register 90 can be controlled directly through an inter connect(s) 86 and physical layer port(s) 88. As used herein, a physical layer port is a port through which register 90 can be accessed without the aid of a layer higher than the physical layer, such as BIOS, an operating system, or software. Of course, there may intermediate receivers or other simple circuitry between port(s) 88 and register 90. The signals provided in interconnect(s) 88 may have one or more bits. As an example, port(s) 88 may be a JTAG port(s) or another similar port(s), but that is not required.

An advantage of controlling register 90 directly at the physical level is that the chip can be tested without higher levels such as operating systems, software programs or BIOS. This allows additional validation and compliance opportunities. For example, high volume testing can be applied to a PCI Express link without a fully functional personal computer (PC) platform. Progress can be made in system validation through debugging systems even if BIOS and/or other critical platform issues do not allow a successful operating system initialization. Loopback may be more controlled and repeatable when performed at the physical layer.

In FIG. 3, register 90 is not controlled directly through an interconnect. If it is controlled from a signal external to chip A, it is done so indirectly. Register 90 in FIG. 3 may be controlled through signals on inband interconnects and/or through other events. Note that it is not necessary to have a mode controlling register in control circuitry 24. The mode can be controlled through a state machine in which the result is not held in a register.

When a particular bit or bits in register 90 has a particular state, control circuitry 24 goes into loopback initiating mode either immediately or after another event(s) (e.g., configuration or self tests) and/or signals are received. While it is in loopback initiating mode, control circuitry 24 may control timing and voltage margins of one or more of signals VoutA1+, VoutA1− . . . VoutAN+, VoutAN− in control circuitry 24 or through transmitters TXA1 . . . TXAN through conductors 94 and 96.

Loopback mode may be used for testing, fault isolation, and validation purposes. Comparison circuitry 92 compares what was intended to be sent with what is looped back and received by receivers RXA1 . . . RXAM. The voltage and timing margins of signals D+ and D− may be altered until a miscompare is generated, although that practice is not required. In some embodiments, chip A may send a continuous loopback training sequence to chip B. Chip B may recognize the training sequence, retime the incoming inband signals, and resent them to chip A. Receiver scrambling and 8b/10b decoding/encoding are not required. Loopback initiating mode may end when a sequence is done, when certain miscompares are detected, or in response to some other event(s) or signal(s).

Figure 4:
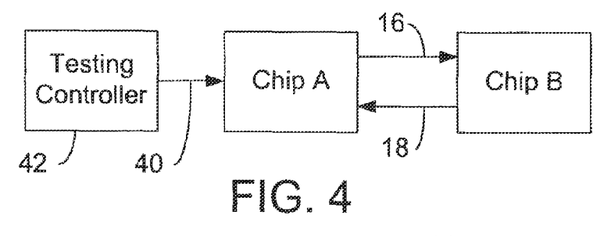
FIG. 4 is a schematic block diagram representation of a system according to some embodiments of the inventions.

There are various ways in which chip A can enter loopback initiating mode. In FIG. 4, a testing controller 42 causes chip A to enter into loopback initiating mode through a signal provided through interconnect(s) 40. Interconnect(s) 40 may be an example of interconnect(s) 86 of FIG. 2 or they may be provide signals to other parts of the chip. After receiving the signals on interconnect(s) 40, chip A may go into loopback initiating mode immediately or only after some other event(s) occur and/or until chip A receives additional signals. Once it is in loopback initiating mode, chip A sends a loopback initiating command to chip B through at least one of inband interconnects 16.

Figure 5:
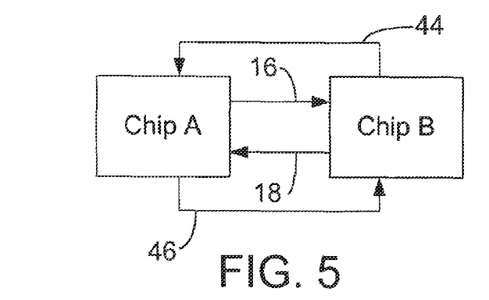
FIG. 5 is a schematic block diagram representation of a system according to some embodiments of the inventions.

In FIG. 5, chip B may cause chip A to be put into a loopback initiating mode through a signal on interconnect(s) 44. Again, interconnect(s) 44 may be an example of interconnect(s) 86 of FIG. 2 or they may be provided to other parts of chip A. As with FIG. 4, chip A may go into loopback initiating mode immediately or only after additional events occur and/or signals are received. Once it is in loopback initiating mode, chip A sends a loopback initiating command to chip B through at least one of inband interconnects 16. Chip A can also cause chip B to go into loopback initiating mode with a signal through interconnect(s) 46. In that case, chip B would send a loopback initiating command to chip A through at least one of inband interconnects 18.

Figure 6:
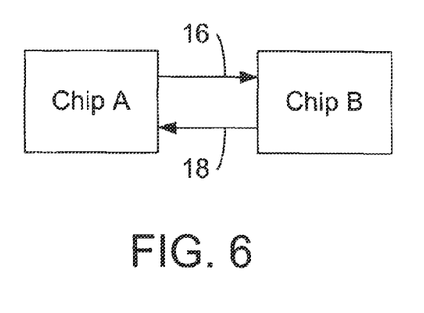
FIG. 6 is a schematic block diagram representation of a system according to some embodiments of the inventions.

In FIG. 6, in some embodiments, chip A may enter loopback initiating mode following power up or some other event independent of receiving a signal from another chip, or through a signal from another chip. In other embodiments, chip A may enter loopback initiating mode following receiving a signal from another chip that is not designed for that purpose but which nevertheless causes chip A to go into loopback initiating mode in combination whether another condition(s) and/or signal(s). In other embodiments, Chip A may go into loopback initiating mode in response to a signal over at least one of inband interconnects 18.

Figure 7:
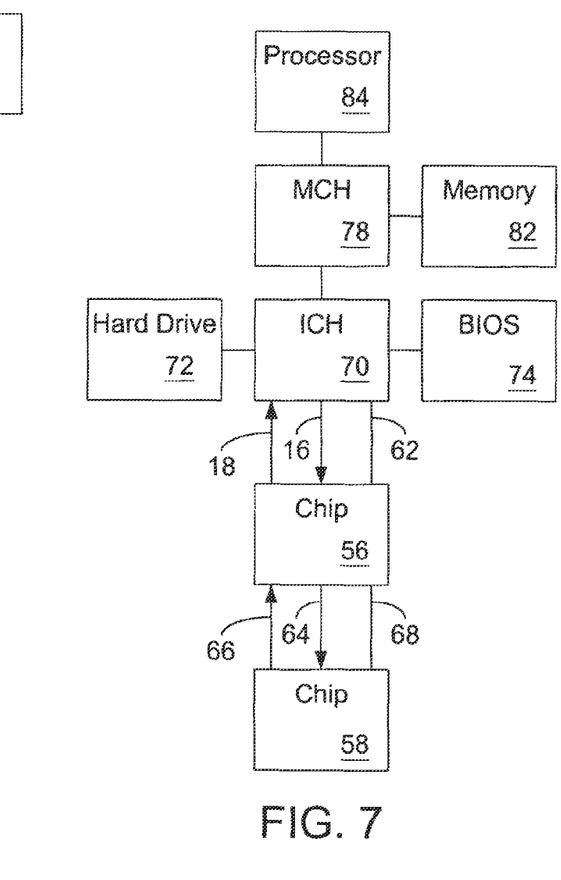
FIG. 7 is a schematic block diagram representation of a system according to some embodiments of the inventions.

Chips including the loopback features described herein may be in computer systems. FIG. 7 is an example of such a computer system, although the inventions are not limited to use in such systems. An memory controller hub (MCH) 78 is coupled to a processor 84, memory 82, and an input/ouput hub (ICH) 70. ICH 78 is coupled to a hard drive 72, BIOS 74, and a chip 56. Chip 56 is also coupled to chip 58. Inband interconnects 16 and 18 are coupled between ICH 70 and chip 56. Inband interconnects 64 and 64 are coupled between chips 56 and 58. Interconnects 62 and 68 may include interconnects that carry signals like those of interconnects 40, 44, or 46 in FIGS. 4 and 5. In the case of FIG. 7, an operating system or program in hard drive 72 or memory 82, or firmware in BIOS 74 may cause a chip to be in loopback initiating mode either immediately or following some other event(s) and/or reception of other signal(s). It is also possible that testing controller 42 have an operating system, program, or BIOS but that is not required.

The transmitters, interconnects, and receivers act as serial links In some embodiments, the link includes lanes, where a lane is formed of interconnects between two opposite pairs of transmitters and receivers. For example, a lane might include interconnects 30-1, 32-1, 36-1, and 38-1, where interconnects 30-1 and 32-1 carry signals from chip A to chip B and interconnects 36-1 and 38-1 carry signals from chip B to chip A. However, the use of such lanes is not required. Control circuitry 24 and 34 may be such that a loopback initiating command in any of the lanes causes all the lanes to loopback or some specified lanes in addition to the one containing the loopback initiating command. In some embodiments, loopback is initiated only for the lanes including the loopback initiating commands. In other embodiments, a command in one lane can initiate loopback for some or all lanes in the link. There may be different types of loopback initiating commands.

In FIG. 1, decoupling capacitors C1-1, C2-1 . . . C1-N, C2-N, and C3-1, C4-1 . . . C3-M and C4-M are in series in interconnects 30-1, 32-1 . . . 30-N, 32-N, and 36-1, 38-1 . . . 36-M, 38-M, respectively. The decoupling capacitors block direct current (DC) voltage but pass higher frequency signals. Decoupling capacitors C1-1, C2-1, C1-N, and C2-N are illustrated as being on the interconnect externally from the chip, whilst decoupling capacitors C3-1, C4-1, C3-M, and C4-M are illustrated as being in the chip. However, each of the decoupling capacitors could be external. Depending on the capacitance of the decoupling capacitors, it may be impractical to have a decoupling capacitor on die. For example, the decoupling capacitors may be about 75 nanofarads, although they may be more or less than that. The decoupling capacitors may be in the chip package, on a card supporting the chip, on the motherboard or elsewhere. The label 30-1 is intended to be the label for the interconnect on each side of decoupling capacitor CAC1-1. Decoupling capacitors may be useful where chips A and B have different voltages. Some embodiments do not include decoupling capacitors.

The inband signals are not restricted to any particular type of signaling. The inband signals may be, for example, be packetized or time multiplexed. In some embodiments, the signaling may be of the type in which the clock is recovered from the inband signals D+ and D− and used to provide a sampling clock in phase with data of the inband signals.

Figure 8:
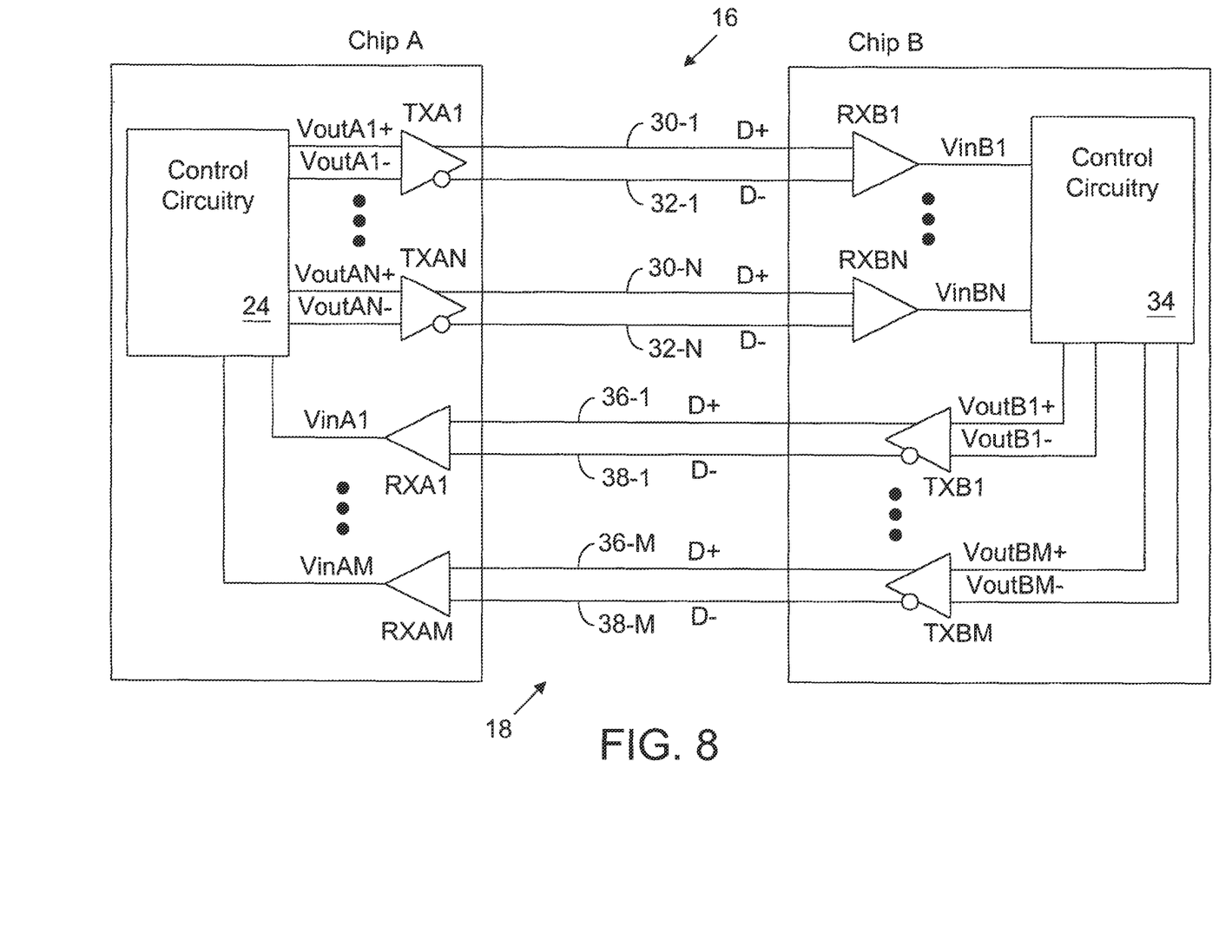
FIG. 8 is a schematic block diagram representation of a system according to some embodiments of the inventions.

FIG. 8 illustrates that serial decoupling capacitors are not required in the interconnects. FIG. 8 further illustrates the receivers may convert from differential to single ended signals. The transmitters could convert a single ended signal to a differential signal.

Figure 9:
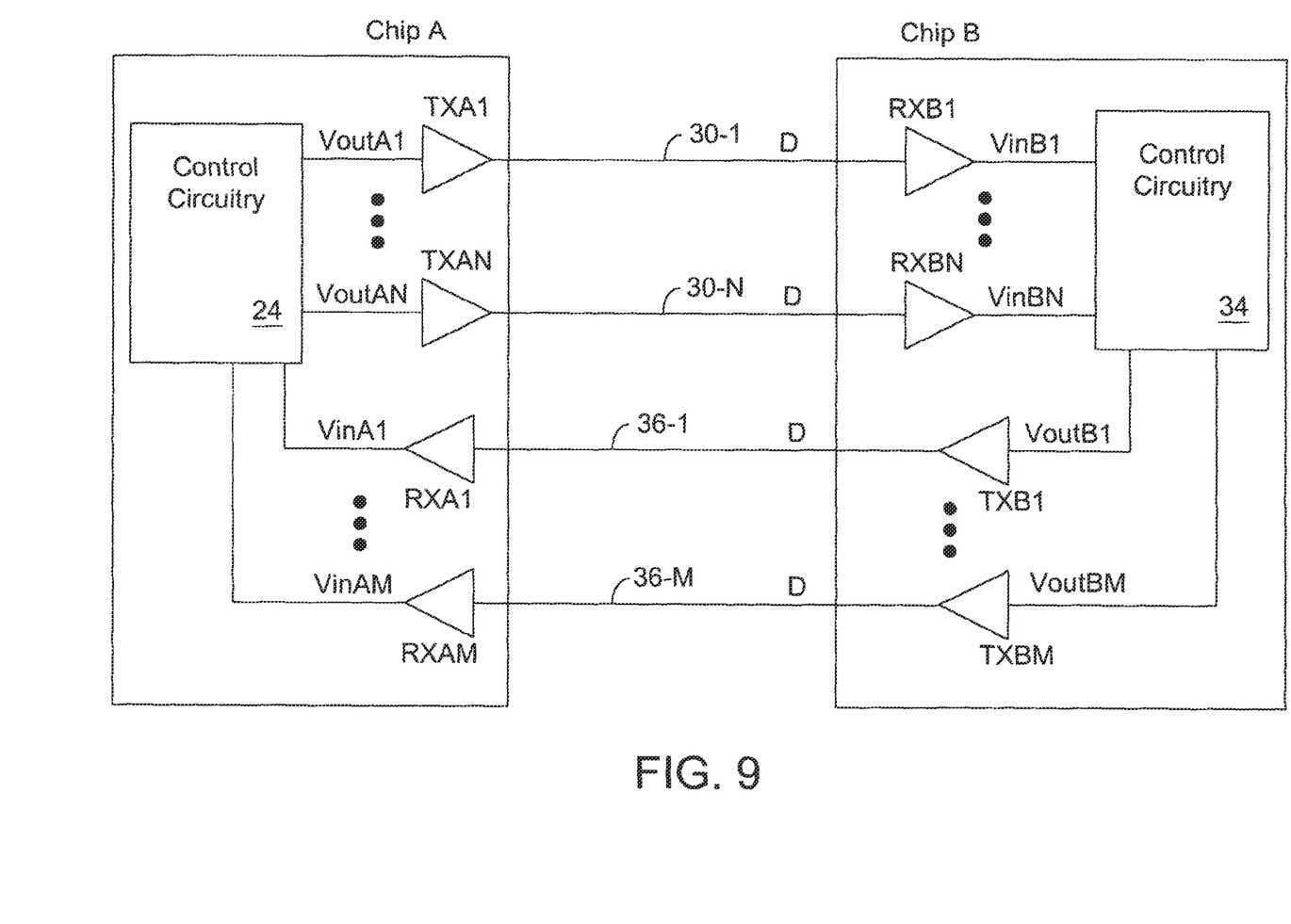
FIG. 9 is a schematic block diagram representation of a system according to some embodiments of the inventions.

FIG. 9 illustrates that single ended signals may be used for the interconnects rather than differential signals.

Figure 10:
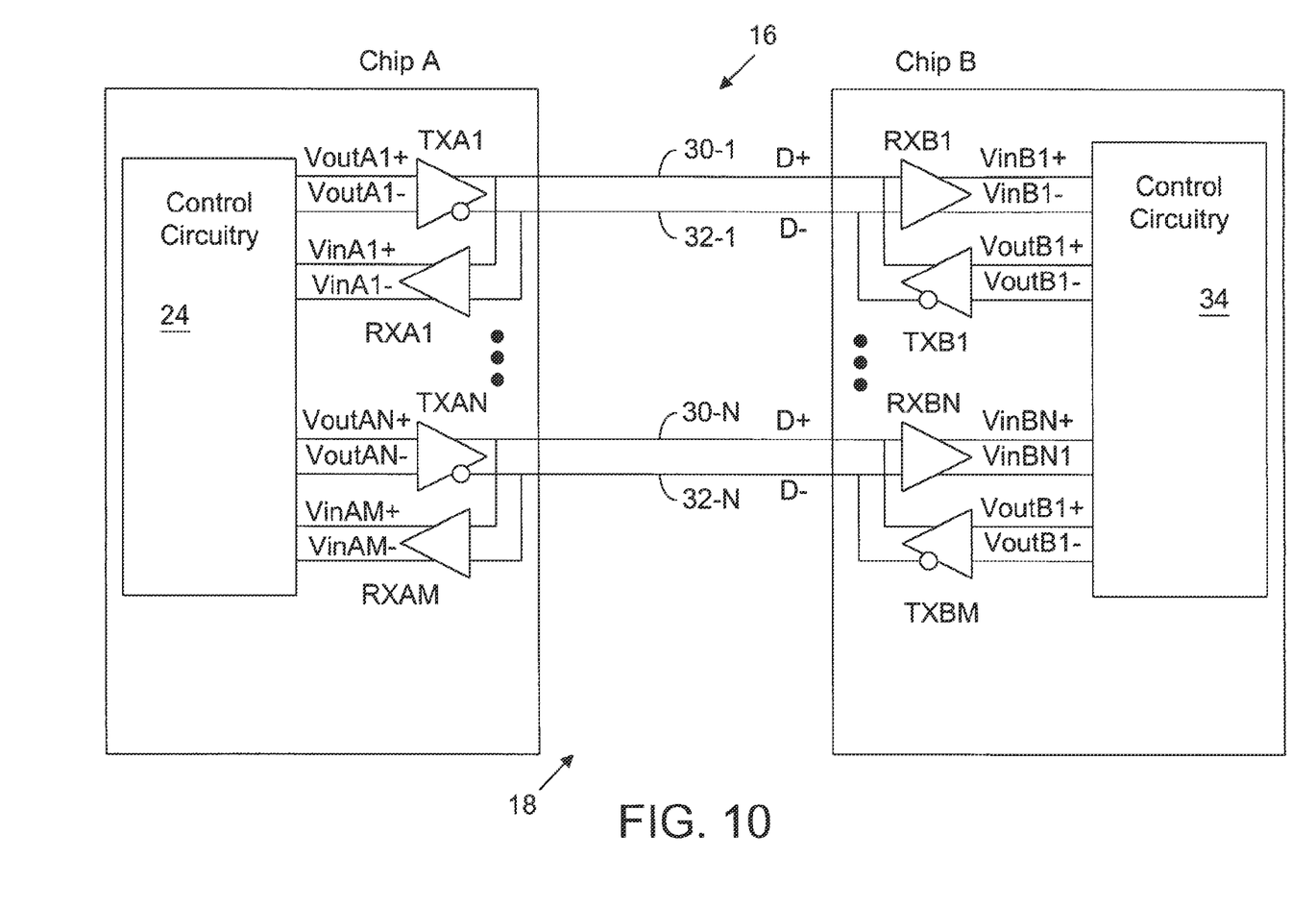
FIG. 10 is a schematic block diagram representation of a system according to some embodiments of the inventions.

FIG. 10 illustrate bi-directional interconnects. The bi-directional signal may be sequential or simultaneous. In the case sequential bi-directional signals, signals to be looped back and signals being loopbacked could be interspersed or completely sequential. In the case of simultaneous bi-directional signals, the interconnects could simultaneously carry signals to be loopedback and other signals being loopbacked back.

Figure 11:
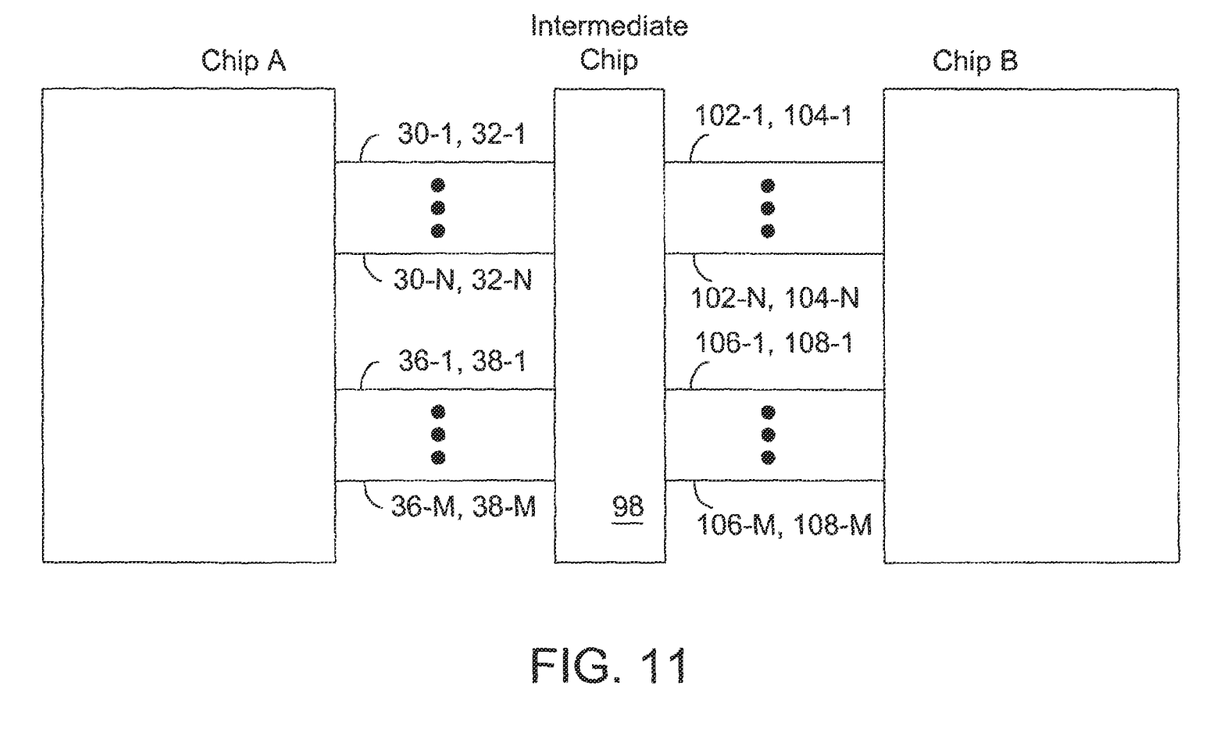
FIG. 11 is a schematic block diagram representation of a system according to some embodiments of the inventions.

FIG. 11 illustrates that there may be an intermediate chip 98 between chips A and B. Interconnects 102-1, 104- . . . 102-N, 104-N and 106-1, 108-1 . . . 106-M, 108-M carry differential signals, but they could be signal ended and/or bi-directional as discussed. The various features described in connection with the different figures may be mixed and matched in different embodiments.

There are different ways in which chip A can indicate the end of loopback. One way is to provide an end of loopback character through signals D+ and D−. A drawback of this approach is that using such a character may limit voltage or timing stressing in loopback. Under another approach, chip A indicates the end of loopback by causing signal D+ to equal signal D− (sometimes called squelch and electrical idle) for at least a particular amount of time. During the time D+=D− in electrical idle, the inputs to the corresponding transmitters of chip A may be in high impedance. Under yet another approach, chip A indicates the end of loopback by not changing D+ or D− for a certain amount of time. In the case of single ended interconnects (not differential interconnects), loopback mode may be ended in response to the interconnect being held to a certain voltage or within a certain voltage range for a particular amount of time.

2. Additional Details of Some Implementations

Some embodiments of the invention are implemented so as to be compliant with a PCI Express specification, but that is not required. The invention may be implemented in a way that is not PCI Express compliant. Further, the relevant aspects of the PCI Express standard may change over time. Neither PCI Express nor the inventions are not restricted to these details.

Only the entry and exit behavior is specified, all other details are implementation specific. Loopback can operate on a lane or a link basis. When a Link is in loopback, the symbols received are "looped back" to the transmitter on the same Lane. The entry mechanism for chip A is device specific. The system designer is responsible to ensure that two connected devices do not initiate chip A requests at the same time. Chip B enters loopback whenever two or more consecutive training sequences TS1 or TS2 ordered-sets are received with the loopback bit set. Loopback is exited by the sending of an electrical idle ordered-set followed by electrical idle.

Once in the loopback state, chip A can send any pattern of symbols as long as the rules of 8b/10b encoding are followed. The mechanism used by chip A to enter the loopback state is implementation specific.

Chip A enters loopback when directed. In a Loopback.Entry state, linkup=0 (status is set false). Chip A transmits TS1 ordered sets with the loopback bit (bit 2) asserted to chip B until chip A receives TS1 ordered sets with the loopback bit asserted. This indicates chip B has successfully entered loopback. The next state of Loopback.Active. In the initiating device (chip A), timeout from loopback entry is implementation specific. The exit is to the Loopback.Exit state.

Chip B enters loopback when two or more consecutive TS1 ordered-sets are received with the loopback bit set. Under one proposal, loopback must be entered within the receipt of 1024 consecutive TS1 ordered sets with the loopback bit set. The next state is Loopback.Active.

In the Loopback.Active state, chip A is sending valid 8b/10b data. The next state of chip A is the Loopback.Exit state if directed.

In the Loopback.Active state, chip B is required to retransmit each 10b data and control symbol exactly as received, without applying scrambling/descrambling or disparity corrections, with three exceptions:

1. If a received 10b symbol is determined to be an invalid 10b code (i.e., no legal translation to a control or data value possible) then chip B must instead transmit the EDB (bad character) symbol in the corresponding time slot of the invalid symbol. Either a positive or negative disparity can be chosen for the EDB symbol.

2. If a SKP (skip) ordered set retransmission requires adding a SKP symbol to accommodate timing tolerance correction, the SKP symbol is inserted in the retransmitted symbol stream anywhere in the SKP ordered set following the COM symbol. Either a positive or negative disparity can be chosen for the inserted SKP symbol.

3. If a SKP ordered set retransmission requires dropping a SKP symbol to accommodate timing tolerance correction, the SKP symbol is simply not retransmitted and transmission continues with the next received symbol or an EDB, as defined above.

As a result of these rules, received valid 10b codes are retransmitted even if they fail to match expected disparity in the receiver and result in retransmission violating normal disparity rules.

The next state of chip B is the Loopback.Exit state when an electrical idle ordered-set is received, or if an electrical idle condition is detected. Note, chip B must be able to detect electrical idle was entered within 2 milliseconds (ms) in case the electrical idle ordered set is not properly detected.

In the Loopback.Exit state, chip A sends an electrical idle ordered set and goes to a high impedance electrical idle for a minimum of 2 ms. Chip B echoes the electrical idle ordered set and goes to a high impedance electrical idle for a minimum of 2 ms.

Training sequences (TS) are composed of ordered-sets used for bit alignment, symbol alignment and to exchange physical layer parameters. Training sequence ordered sets are not scrambled but are 8b/10b encoded. TS1 and TS2 are shown in table 1 below. SKP ordered-sets may be transmitted during training sequences but not interrupt a TS1 or TS2 ordered-set.

TABLE 1

TS1 and TS2 Ordered-Sets

| Symbol Number | Allowed Values | Encoded Values | Description |
| --- | --- | --- | --- |
| 0 | | K28.5 | COMMA code group for symbol alignment |
| 1 | 0-255 | D0.0-D31.7, K23.7 | Link number within component |
| 2 | 0-31 | D0.0-D31.0, K23.7 | Lane number within port |
| 3 | 0-255 | D0.0-D31.7 | N_FTS. This is the number of fast training ordered-sets required by the receiver to obtain reliable bit and symbol lock. |
| 4 | 2 | D2.0 | Data Rate Identifier Bit 0 - Reserved, set to 0 Bit 1 = 1, generation 1 (2.5 Gb/s) data rate supported Bit 2:7 - Reserved, set to 0 |
| 5 | Bit 0 = 0, 1 Bit 1 = 0, 1 Bit 2 = 0, 1 Bit 3 = 0, 1 Bit 4:7 = 0 | D0.0, D1.0, D2.0, D4.0 D8.0 | Training Control Bit 0 = 0, de-asserted reset Bit 0 = 1, asserted reset (asserted) Bit 1 = 0, enable link Bit 1 = 1, disable link (asserted) Bit 2 = 0, no loopback Bit 2 = 1, enable loopback (asserted) Bit 3 = 0, enable scrambling Bit 3 = 1, disable scrambling (asserted) Bit 4:7, reserved (set to 0 unasserted) |
| 6-15 for TS1 | | D10.2 | TS1 identifier |
| 6-15 for TS2 | | D5.2 | TS2 identifier |

Additional Information

An embodiment is an implementation or example of the inventions. Reference in the specification to "an embodiment," "one embodiment," "some embodiments," or "other embodiments" means that a particular feature, structure, or characteristic described in connection with the embodiments is included in at least some embodiments, but not necessarily all embodiments, of the inventions. The various appearances "an embodiment," "one embodiment," or "some embodiments" are not necessarily all referring to the same embodiments.

If the specification states a component, feature, structure, or characteristic "may", "might", or "could" be included, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

The inventions are not restricted to the particular details listed herein. Indeed, those skilled in the art having the benefit of this disclosure will appreciate that many other variations from the foregoing description and drawings may be made within the scope of the present inventions. Accordingly, it is the following claims including any amendments thereto that define the scope of the inventions.

What is claimed is:

1. An apparatus comprising:
 a receiver to receive an in-band loopback request from a device over an interconnect comprising one or more serial point-to-point differential links, wherein each link of the one or more serial point-to-point differential links includes a plurality of lanes; and
 a logic to:
  interpret the in-band loopback request received from the receiver; and
  enter a loopback state based at least in part on the loopback request, wherein some but not all lanes of the plurality of lanes in the link enter loopback state based on the loopback request; and adjust output voltage level and timing for a transmitter based at least in part on information in the loopback request, wherein the logic to adjust the output voltage level and timing until a miscompare is generated indicating a boundary of the voltage level and timing.

2. The apparatus of claim 1, wherein the receiver is further configured to:

receive data over the interconnect; and wherein the logic is further configured to:

loopback at least some of the received data while in the loopback state.

3. The apparatus of claim 2, wherein the data is received from the device.

4. The apparatus of claim 2, wherein the data is received over a particular lane of the interconnect and looping back includes sending a copy of the at least some of the received data to a transmitter on the particular lane.

5. The apparatus of claim 1, wherein the logic is further configured to:

receive a signal;

interpret the signal to indicate an end of the loopback state; and exit the loopback state based at least in part on the signal.

6. The apparatus of claim 5, wherein the signal comprises an electrical idle exceeding a predetermined minimum time interval.

7. The apparatus of claim 5, wherein the signal comprises at least one electrical idle ordered set.

8. The apparatus of claim 1, wherein the in-band loopback request comprises a loopback initiating command.

9. The apparatus of claim 1, wherein the in-band loopback request comprises data included in a Peripheral Component Interconnect Express (PCIe) training sequence.

10. The apparatus of claim 1, wherein the in-band loopback request corresponds to a configuration event.

11. The apparatus of claim 1, wherein the interconnect comprises at least one of a physical layer to support a Peripheral Component Interconnect Express (PCIe) protocol layer, a physical layer including one or more protocols.

12. The apparatus of claim 1, wherein the interconnect comprises a Peripheral Component Interconnect Express compliant interconnect.

13. An apparatus comprising:

a control module to generate a loopback initiation request; and a transmitter to send the loopback initiation request generated by the control module to a device as an in-band signal over an interconnect comprising one or more serial point-to-point differential links, wherein each link of the one or more serial point-to-point differential links includes a plurality of lanes, wherein the loopback initiation request is to indicate that the device is to enter a loopback state, wherein some but not all lanes of the plurality of lanes in the link enter the loopback state based on the loopback initiation request, wherein a logic unit to adjust output voltage level and timing for the transmitter based at least in part on information in the loopback initiation request, and wherein the logic unit to adjust the output voltage level and timing until a miscompare is generated indicating a boundary of the voltage level and timing.

14. The apparatus of claim 13, wherein the transmitter to send data to the device, following the loopback initiation request; and wherein the apparatus further comprises a receiver to receive a copy of at least a portion of the data looped back by the device.

15. The apparatus of claim 13, wherein the loopback initiation request comprises data to be included in a Peripheral Component Interconnect Express (PCIe) training sequence.

16. The apparatus of claim 15, wherein the PCIe training sequence includes a loopback bit, wherein the loopback bit, when set, indicates that the device is to enter the loopback state.

17. The apparatus of claim 15, wherein the PCIe training sequence comprises one or more ordered sets.

18. The apparatus of claim 15, wherein the PCIe training sequence comprises a TS1 training sequence.

19. The apparatus of claim 15, wherein the PCIe training sequence comprises a TS2 training sequence.

20. The apparatus of claim 13, wherein the control module is further configured to: send a signal indicating an end to the loopback state.

21. The apparatus of claim 20, wherein the signal comprises an electrical idle.

22. The apparatus of claim 20, wherein the signal comprises at least on electrical idle ordered set.

23. The apparatus of claim 13, wherein the interconnect comprises at least one of a physical layer to support a Peripheral Component Interconnect Express (PCIe) protocol layer, a physical layer including one or more protocols.

24. The apparatus of claim 13, wherein the interconnect comprises a Peripheral Component Interconnect Express compliant interconnect.

25. An apparatus comprising:

a receiver to receive data over an interconnect including two or more ordered sets in a Peripheral Component Interconnect Express (PCIe) training sequence from a device over an interconnect comprising a point-to-point serial data link including a plurality of lanes, wherein each of the two or more ordered sets include a respective loopback bit set; and a control module to:

enter a loopback state based at least in part on receiving the two or more ordered sets with loopback bits set from the receiver;

loopback at least some of the received data to the device during the loopback state, wherein some but not all lanes of the plurality of lanes in the point-to-point serial data link enter the loopback state based on the loopback bit set;

receive an electrical idle ordered set over the interconnect;

echo the electrical idle ordered set; and exit the loopback state based at least in part on the electrical idle ordered set; and adjust output voltage level and timing for a transmitter based at least in part on information in the loopback request, wherein the control module to adjust the output voltage level and timing until a miscompare is generated indicating a boundary of the voltage level and timing.

26. A system comprising:

a Peripheral Component Interconnect Express (PCIe)-compliant interconnect comprising one or more serial point-to-point differential links, wherein each link of the one or more serial point-to-point differential links includes a plurality of lanes;

a first device; and a second device, wherein the second device is communicatively coupled to the first device using the PCIe-compliant interconnect and the second device includes:
a receiver to:
receive in-band loopback requests from the first device over the interconnect; and
cause the second device to enter a loopback state based at least in part on receiving a loopback request, wherein some but not all lanes of the plurality of lanes in the link enter the loopback state based on the loopback request; and
a transmitter to:
generate loopback requests; and
send loopback requests to the first device as in-band signals over the interconnect, wherein loopback requests from the second device is to indicate that the first device is to enter a loopback state,
wherein the receiver to adjust output voltage level and timing for the transmitter based at least in part on information in the loopback request, wherein the receiver to adjust the output voltage level and timing until a miscompare is generated indicating a boundary of the voltage level and timing.

27. The system of claim 26, wherein the first device further comprises a receiver and a transmitter.

28. The system of claim 26, wherein the first device comprises a first chip and the second device comprises a second chip.

29. The system of claim 26, wherein the second device comprises a chip on a motherboard.

30. A method comprising:
receiving, by a receiver, an in-band loopback request from a device over an interconnect comprising one or more serial point-to-point differential links, wherein each of the one or more serial point-to-point differential links includes a plurality of lanes;
interpreting, by a control module, the in-band loopback request; and
entering, by the control module, a loopback state based at least in part on the loopback request, wherein some but not all lanes of the plurality of lanes in the link enter the loopback state based on the loopback request; and
adjusting output voltage level and timing for a transmitter based at least in part on information in the loopback request, wherein adjusting the output voltage level and timing is performed until a miscompare is generated indicating a boundary of the voltage level and timing.

31. The method of claim 30, further comprising:
receiving data over the interconnect; and
looping back at least some of the received data while in the loopback state.

32. The method of claim 31, wherein the data is received over a particular lane of the interconnect from a transmitting device and looping back includes sending a copy of the at least some of the received data to the transmitting device on the particular lane.

33. The method of claim 31, further comprises:
receiving a signal by the control module;
interpreting, by the control module, the signal to indicate an end of the loopback state; and
exiting, by the control module, the loopback state based at least in part on the signal.

34. The method of claim 33, wherein the signal comprises an electrical idle exceeding a predetermined minimum time interval.

* * * * *